US010658059B2

(12) United States Patent
Griffin et al.

(10) Patent No.: US 10,658,059 B2
(45) Date of Patent: *May 19, 2020

(54) PERFORMANCE EVALUATION OF SOLID STATE MEMORY DEVICE

(71) Applicant: International Business Machines Corporation, Armonk, NY (US)

(72) Inventors: Thomas J. Griffin, Salt Point, NY (US); Dustin J. VanStee, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

This patent is subject to a terminal disclaimer.

(21) Appl. No.: 15/293,853

(22) Filed: Oct. 14, 2016

(65) Prior Publication Data
US 2017/0032847 A1    Feb. 2, 2017

Related U.S. Application Data

(63) Continuation of application No. 13/627,483, filed on Sep. 26, 2012, now Pat. No. 9,524,800.

(51) Int. Cl.
*G06F 11/08* (2006.01)
*G11C 16/34* (2006.01)
(Continued)

(52) U.S. Cl.
CPC ...... *G11C 16/3495* (2013.01); *G06F 11/1471* (2013.01); *G11C 29/04* (2013.01);
(Continued)

(58) Field of Classification Search
CPC ......... G06F 12/0246; G06F 2212/7201; G06F 2212/7208; G06F 3/0679; Y02B 60/112; H04L 43/50
See application file for complete search history.

(56) References Cited

U.S. PATENT DOCUMENTS 5,537,357 A * 7/1996 Merchant ............... G11C 16/10
                                                365/185.22
5,563,833 A * 10/1996 Adams ................ G06F 12/0893
                                                365/201
(Continued)

FOREIGN PATENT DOCUMENTS

EP       0869436 A2    10/1998
JP       2011138273 A   7/2011
WO       2011149760 A1  12/2011

OTHER PUBLICATIONS

Gerhold, et al., "Pageserver: High-Performance SSD-Based Checkpointing of Transactional istributed Memory", 2010 Second International Conference on Computer Engineering and Applications, Mar. 19-21, 2010; vol. 1, pp. 235-239.

*Primary Examiner* — Mischita L Henson
*Assistant Examiner* — Christine Y Liao
(74) *Attorney, Agent, or Firm* — Cantor Colburn LLP

(57) ABSTRACT

Embodiments relate methods and computer program products for performance testing of a solid state memory devices. The method includes operating a first solid state memory device for a period of time and capturing state information of the first solid state memory device after the period of time. The method also includes storing the state information in a control file and loading the control file onto a second solid state memory device. Once the control file has been loaded into the second solid state memory device the state information can be adapted to fix any issues due to physical variation. Performance testing can then be preformed on the second solid state memory device without preconditioning the second solid state memory device.

17 Claims, 5 Drawing Sheets

(51) Int. Cl.
*G06F 11/14* (2006.01)
*G11C 29/04* (2006.01)
*G11C 29/40* (2006.01)

(52) U.S. Cl.
CPC ........... *G06F 2212/7208* (2013.01); *G11C 2029/4002* (2013.01)

(56) References Cited

U.S. PATENT DOCUMENTS

| | | |
|---|---|---|
| 9,524,800 B2 | 12/2016 | Griffin et al. |
| 2003/0126389 A1* | 7/2003 | Mackrory ............ G06F 11/1458 711/162 |
| 2006/0129899 A1* | 6/2006 | Cochran ............... G06F 11/106 714/718 |
| 2008/0301511 A1 | 12/2008 | Miller et al. |
| 2009/0038011 A1 | 2/2009 | Nadathur |
| 2009/0089610 A1 | 4/2009 | Rogers et al. |
| 2009/0296505 A1* | 12/2009 | Shibazaki ............... G11C 29/20 365/201 |
| 2009/0327840 A1 | 12/2009 | Moshayedi |
| 2010/0262857 A1* | 10/2010 | Enarson ............... G06F 11/073 714/2 |
| 2011/0238971 A1 | 9/2011 | Heo et al. |
| 2011/0246823 A1 | 10/2011 | Khan et al. |
| 2011/0296079 A1 | 12/2011 | Kotzur et al. |
| 2012/0042211 A1 | 2/2012 | Brown et al. |
| 2012/0047287 A1 | 2/2012 | Chiu et al. |
| 2012/0198174 A1 | 8/2012 | Nellans et al. |

* cited by examiner

PERFORMANCE EVALUATION OF SOLID STATE MEMORY DEVICE

DOMESTIC PRIORITY

This application is a continuation of U.S. application Ser. No. 13/627,483, entitled, "PERFORMANCE EVALUATION OF SOLID STATE MEMORY DEVICE," filed Sep. 26, 2012, the disclosure of which is incorporated by reference herein in its entirety.

BACKGROUND

The present invention relates generally to solid state memory devices, and more specifically, to performance evaluation of solid state memory devices.

Solid state memory devices are often characterized by complex operating characteristics that may radically affect the performance of the devices. For example, the difference in performance between two solid state memory devices that are accessed in a similar manner is substantially impacted upon the write history of the devices. Accordingly, in order to perform comparable performance evaluations of solid state memory devices, the devices must be preconditioned to ensure that the states of the devices are the same.

One of the challenges with extracting performance data from solid state memory device, such as flash devices, is the amount of time required to precondition a device before performing testing on the device. Solid state memory devices have a set of access restrictions that employ features such as wear leveling to evenly utilize and wear solid state memory devices over time. The introduction of the wear leveling style algorithms requires the solid state memory device to utilize a mapping table to keep track of both the physical and the logical location of stored data. As the solid state memory device is written to, the mapping table is updated to keep track of where the new logical data is stored in the solid state memory device based on the available free blocks in the solid state memory device.

To obtain a performance measurement for a specific workload for a solid state memory device, it takes time to stabilize the mapping table of the device to get the device in the proper state, which may take hours to complete. Furthermore, as more workloads are generated for the solid state memory device, the performance results for the new workload are highly dependent on the previous activity to the device due to the preconditioning effect. This makes replication of performance results from test to test very difficult to without adequate preconditioning time and it also causes performance tests to last for days to weeks.

SUMMARY

Embodiments include methods for performance testing of a solid state memory devices. The method includes operating a first solid state memory device for a period of time and capturing state information of the first solid state memory device after the period of time. The method also includes storing the state information in a control file and loading the control file onto a second solid state memory device. Once the control file has been loaded into the second solid state memory device the state information can be adapted to fix any issues due to physical variation. Performance testing can then be preformed on the second solid state memory device without preconditioning the second solid state memory device.

Embodiments also include a computer program product for performance testing of solid state memory devices, the computer program product including a tangible storage medium readable by a processing circuit and storing instructions for execution by the processing circuit for performing a method. The method includes operating a first solid state memory device for a period of time and capturing state information of the first solid state memory device after the period of time. The method also includes storing the state information in a control file and loading the control file onto a second solid state memory device. Once the control file has been loaded into the second solid state memory device performance testing can be preformed on the second solid state memory device without preconditioning the second solid state memory device.

Embodiments further include a method for performance testing of solid state memory devices including operating, by a processor, a first solid state memory device for a period of time and capturing a state information of the first solid state memory device after the period of time. The method also includes storing the state information in a control file and loading the control file into a simulator. The method further includes simulating activity of a solid state memory device for a second period of time and generating a second control file by the simulator. The method also includes loading the second control file onto a second solid state memory device and performing performance testing on the second solid state memory device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

In exemplary embodiments, methods and systems for obtaining and applying checkpoint information for performance testing of a solid state memory device are provided. As used herein, a solid state memory device checkpoint is a function that extracts the pertinent state information from a solid state memory device and saves it to a control file. Control files can be loaded onto another solid state memory device of the same architecture such that the state of this new solid state memory device is exactly equal to the state of the first solid state memory device. Once the control file is loaded, a performance workload can be run from the exact same state as the first solid state memory device. In exemplary embodiments, by loading the control file on a solid state memory device the need to precondition the solid state memory device prior to extracting valid performance measurements can be eliminated.

Figure 1:
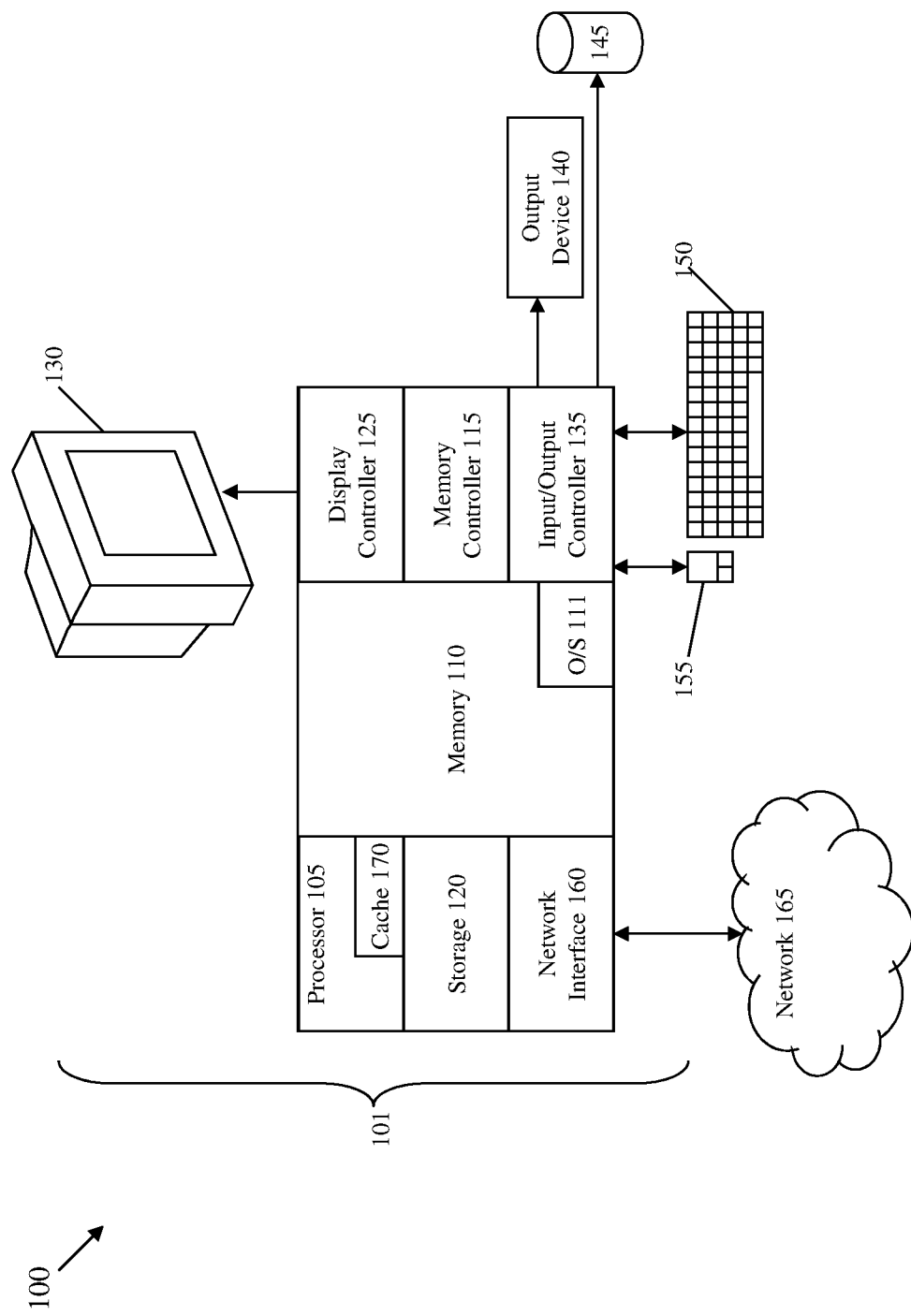
FIG. 1 depicts a block diagram of a system in accordance with an exemplary embodiment.

FIG. 1 illustrates a block diagram of an exemplary computer system 100 for use with the teachings herein. The methods described herein can be implemented in hardware software (e.g., firmware), or a combination thereof. In an exemplary embodiment, the methods described herein are implemented in hardware, and is part of the microprocessor of a special or general-purpose digital computer, such as a personal computer, workstation, minicomputer, or mainframe computer. The system 100 therefore includes general-purpose computer 101.

In an exemplary embodiment, in terms of hardware architecture, as shown in FIG. 1, the computer 101 includes a processor 105, memory 110 coupled via a memory controller 115, a storage device 120, and one or more input and/or output (I/O) devices 140, 145 (or peripherals) that are communicatively coupled via a local input/output controller 135. The input/output controller 135 can be, for example, but not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The storage device 120 may include one or more hard disk drives (HDD), solid state drives (SSD), or any other suitable form of storage.

The processor 105 is a computing device for executing hardware instructions or software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing instructions. The processor 105 may include a cache 170, which may be organized as a hierarchy of more cache levels (L1, L2, etc.).

The memory 110 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another, but can be accessed by the processor 105.

The instructions in memory 110 may include one or more separate programs, each of which comprises an ordered listing of executable instructions for implementing logical functions. In the example of FIG. 1, the instructions in the memory 110 include a suitable operating system (OS) 111.

The operating system 111 essentially controls the execution of other computer programs and provides scheduling, input-output control, file and data management, memory management, and communication control and related services.

In an exemplary embodiment, a conventional keyboard 150 and mouse 155 can be coupled to the input/output controller 135. Other output devices such as the I/O devices 140, 145 may include input devices, for example but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 100 can further include a display controller 125 coupled to a display 130. In an exemplary embodiment, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In an exemplary embodiment, network 165 can be a managed IP network administered by a service provider. The network 165 may be implemented in a wireless fashion, e.g., using wireless protocols and technologies, such as Wi-Fi, WiMax, etc. The network 165 can also be a packet-switched network such as a local area network, wide area network, metropolitan area network, Internet network, or other similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a PC, workstation, intelligent device or the like, the instructions in the memory 110 may further include a basic input output system (BIOS) (omitted for simplicity). The BIOS is a set of essential routines that initialize and test hardware at startup, start the OS 111, and support the transfer of data among the storage devices. The BIOS is stored in ROM so that the BIOS can be executed when the computer 101 is activated.

When the computer 101 is in operation, the processor 105 is configured to execute instructions stored within the memory 110, to communicate data to and from the memory 110, and to generally control operations of the computer 101 pursuant to the instructions.

Figure 2:
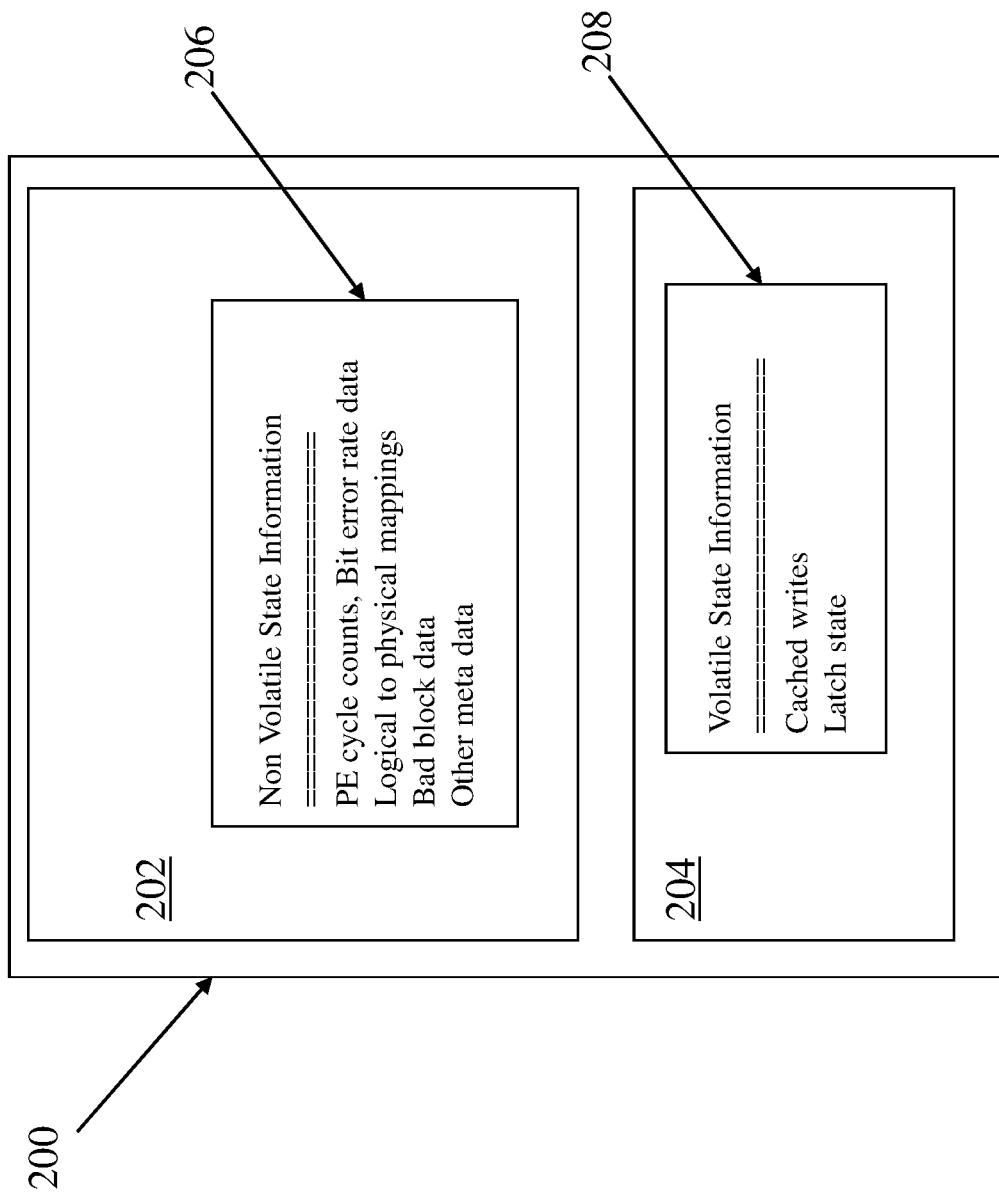
FIG. 2 depicts a block diagram of solid state memory device in accordance with an exemplary embodiment.

Referring now to FIG. 2, a block diagram of solid state memory device 200 in accordance with an exemplary embodiment is shown. The solid state memory device 200 includes a flash array 202 and a controller 204. In exemplary embodiments, the controller 204 is configured to store volatile state information 208 and may include dynamic random access memory (DRAM) for storing the volatile state information 208. The volatile state information 208 may include, but is not limited to, cache write information of the solid state memory device 200, latch state information of the solid state memory device 200, or the like. The flash array 202 includes non-volatile state information 206, which may include, but is not limited to, program-erase (P/E) cycle counts, bit error rate data, logical to physical mappings, bad block data, and other meta data.

Figure 3:
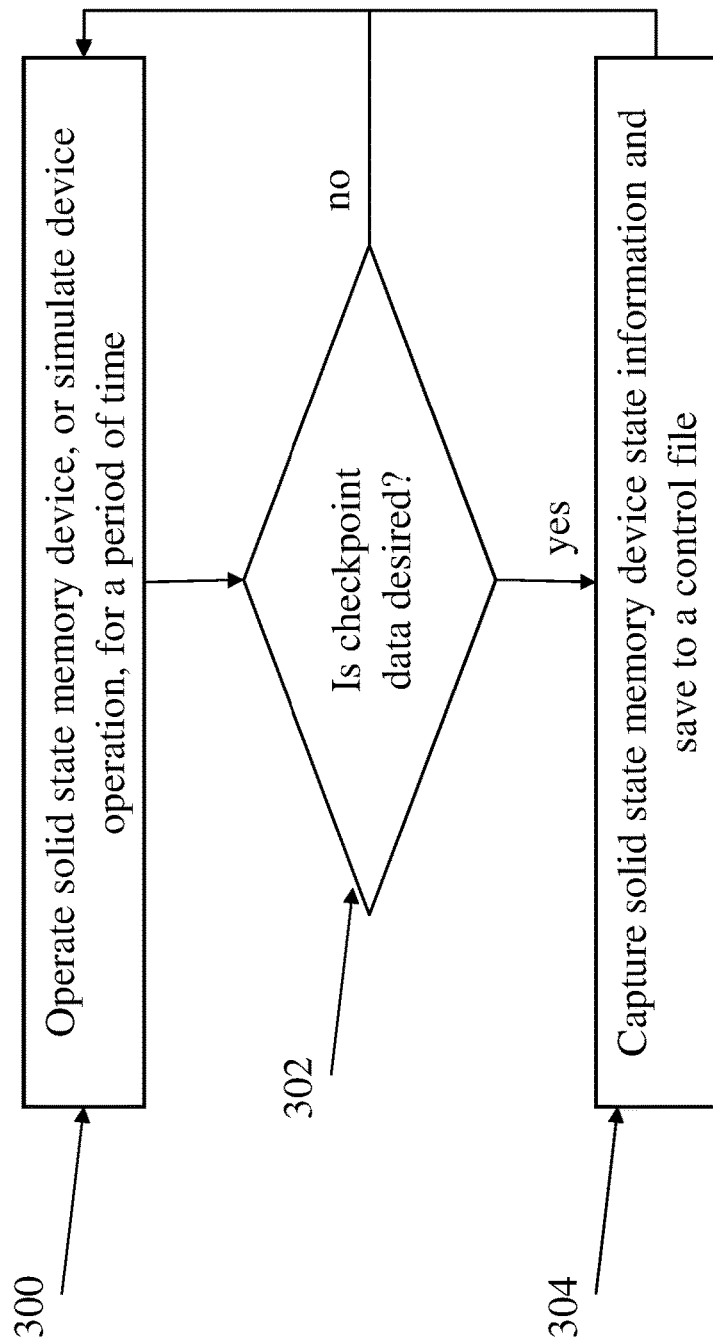
FIG. 3 depicts a process flow for a method of obtaining a checkpoint for a solid state memory device in accordance with an exemplary embodiment.

Referring now to FIG. 3, a process flow for a method of obtaining a checkpoint for a solid state memory device in accordance with an exemplary embodiment is shown. As shown at block 300, the method includes operating solid state memory device, or simulating device operation, for a period of time. In exemplary embodiments, the period of time is selected to be sufficient such that the state of the solid state memory device has reached a desired preconditioned state. Next, as shown at decision block 302, the method includes determining if a checkpoint of the solid state memory device is desired. Based on determining that checkpoint of the solid state memory device is desired, the method proceeds to block 304 and captures the state information of the solid state memory device and saves the state information to a control file. In exemplary embodiments, the state information of the solid state memory device includes both volatile state information and non-volatile state information.

Figure 4:
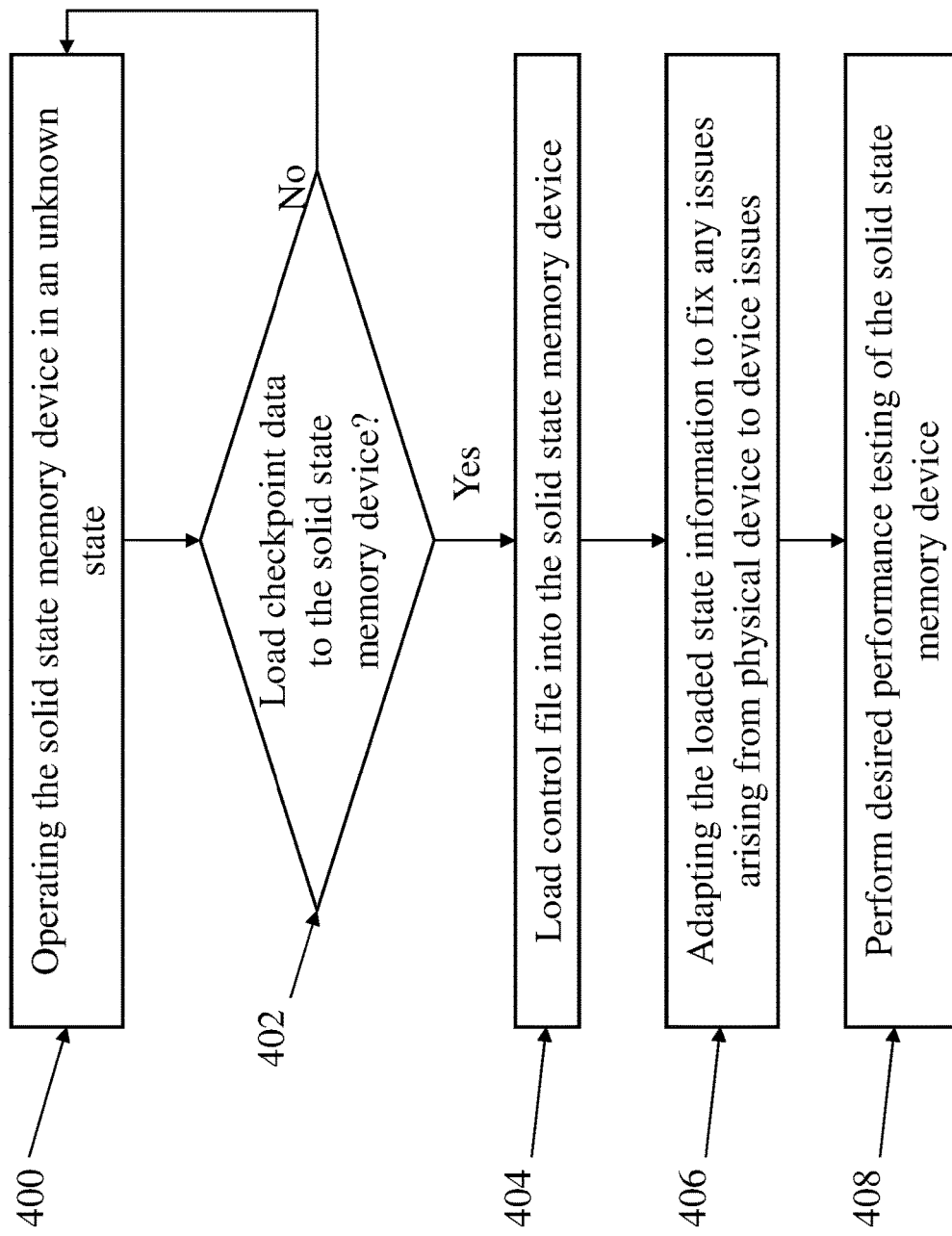
FIG. 4 depicts a process flow for a method of applying a checkpoint to a solid state memory device for performance testing in accordance with an exemplary embodiment.

Referring now to FIG. 4, a process flow for a method of applying a checkpoint to a solid state memory device for performance testing in accordance with an exemplary embodiment is shown. As shown at block 400, the method includes operating the solid state memory device in an unknown state. Next, as shown at decision block 402, the method includes determining if checkpoint data will be loaded to the solid state memory device. Based on determining that checkpoint data will be loaded to the solid state memory device, the method proceeds to block 404 and loads a control file into the solid state memory device. Next, as shown at block 406, the method includes adapting the loaded state information to the solid state memory device to fix any issues arising from physical device to device issues. In exemplary embodiments, adapting the loaded state information may include adjusting the state information to the settings to the device to make sure that the new device will run with the control files. For example, the adjusting may take into account bad blocks that are in different locations, and possibility seeding the physical flash with valid data based on the mapping table so as not to trigger error correction code (ECC) related issues. The method concludes at block 408 by performing desired performance testing of the solid state memory device.

In exemplary embodiments, a solid state memory device checkpoint is a function that extracts the pertinent state information, including both volatile and non-volatile state information, from a solid state memory device and saves that information to a control file. In exemplary embodiments, the control file may be loaded onto another solid state memory device of the same architecture such that the state of this new device is exactly equal to the state of the old device. A solid state memory device of the same architecture is a device that supports the same data file formats, and will behave in a way that is identical to the source device. In exemplary embodiments, the user data itself is not copied; rather, only the logical to physical mapping table is copied along with wear leveling data into the new solid state memory device.

Traditionally for solid state memory devices, a device must be preconditioned for many hours prior to extracting usable performance measurements. In exemplary embodiments, after a control file is loaded to a solid state memory device, a performance workload can be run from the exact same state as the initial device and the performance of the two devices can be accurately compared. Typically, after preconditioning many types of performance measurements are desired, however previous measurements can affect future runs. Accordingly, in exemplary embodiments a user may create a library of checkpoints to quickly test many different device scenarios without incurring the time preconditioning devices.

In exemplary embodiments, the control file is configured to be used with a simulator in addition to being loaded into solid state memory devices. In addition, the output of a simulator may be converted into a control file that is suitable for loading into a solid state memory device. In exemplary embodiments, a simulator can be used to accelerate error condition testing, and also put the device into different end of life scenarios of the solid state memory device.

Figure 5:
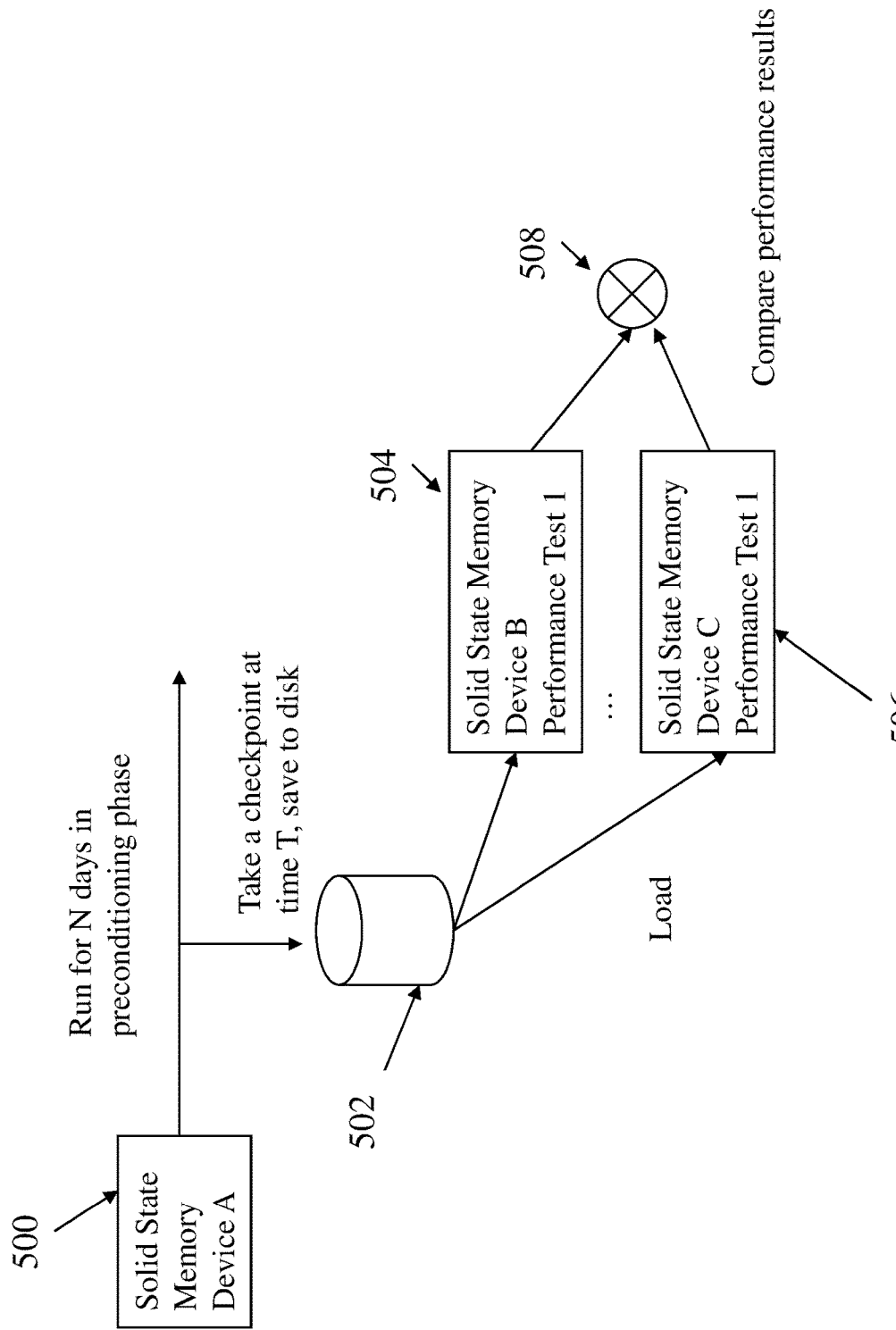
FIG. 5 is a block diagram illustrating a method of performance testing solid state memory devices using checkpointing in accordance with an exemplary embodiment.

Referring now to FIG. 5, a block diagram illustrating a method of performance testing solid state memory devices using checkpointing in accordance with an exemplary embodiment is shown. As illustrated, a solid state memory device A 500 is run for a period of time, N days, in a preconditioning phase. In exemplary embodiments, the solid state memory device A 500 may be physically operated for the period of time or a simulation of the use of the solid state memory device A 500 may be performed. The use of a simulator may be beneficial when the time period desired is a long time, for example a year or more. Next, a checkpoint is taken from the solid state memory device A 500 at time T and saved to a control file on a storage device 502. The control file is then loaded from the storage device 502 onto a solid state memory device B 504 and onto a solid state memory device C 506. After the control files are loaded, performance testing is done on solid state memory device B 504 and solid state memory device C 506. After the testing is completed, the results of the performance tests may be compared by comparator 508.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for performance testing of solid state memory devices, the method comprising:
    selecting a period of time to operate a first solid state memory device for the first solid state memory device to reach a desired preconditioned state;
    operating, by a processor, the first solid state memory device for the period of time;
    capturing state information of the first solid state memory device after the period of time, wherein the state information includes only a program-erase cycle count and a logical to physical mapping table and wear leveling data;
    storing the state information in a control file;
    loading the control file onto a second solid state memory device; and
    performing performance testing on the second solid state memory device without preconditioning the second solid state memory device.

2. The method of claim 1, wherein the state information includes volatile state information and non-volatile state information.

3. The method of claim 2, wherein the non-volatile state information includes at least one of the following:
    a program-erase cycle count;
    a bit error rate;
    a logical to physical mapping; and
    bad block data.

4. The method of claim 1, further comprising adapting the state information to fix any issues due to physical variation.

5. The method of claim 1, further comprising:
    loading the control file onto a third solid state memory device;
    adapting the state information to fix any issues due to physical variation;

performing performance testing on the third solid state memory device; and comparing a result of the performance testing on the third solid state memory device and a result of the performance testing on the second solid state memory device.

6. The method of claim 1, wherein the first solid state memory device and the second solid state memory device have a same architecture.

7. The method of claim 1, wherein after loading the control file onto the second solid state memory device, a state of the second solid state memory device is exactly equal to a state of the first solid state memory device.

8. A computer program product for performance testing of solid state memory devices, the computer program product comprising:

a tangible storage medium readable by a processing circuit and storing instructions for execution by the processing circuit for performing a method comprising:

selecting a period of time to operate a first solid state memory device for the first solid state memory device to reach a desired preconditioned state;

operating the first solid state memory device for the period of time;

capturing state information of the first solid state memory device after the period of time, wherein the state information includes only a program-erase cycle count and a logical to physical mapping table and wear leveling data, and does not include user data written to the first solid state memory device;

storing the state information in a control file;

loading the control file onto a second solid state memory device; and performing performance testing on the second solid state memory device without preconditioning the second solid state memory device.

9. The computer program product of claim 8, wherein the state information includes volatile state information and non-volatile state information.

10. The computer program product of claim 9, wherein the non-volatile state information includes at least one of the following:

a program-erase cycle count;
a bit error rate;
a logical to physical mapping; and
bad block data.

11. The computer program product of claim 8, further comprising adapting the state information to fix any issues due to physical variation.

12. The computer program product of claim 8, further comprising:

loading the control file onto a third solid state memory device;

adapting the state information to fix any issues due to physical variation;

performing performance testing on the third solid state memory device; and comparing a result of the performance testing on the third solid state memory device and a result of the performance testing on the second solid state memory device.

13. The computer program product of claim 8, wherein the first solid state memory device and the second solid state memory device have a same architecture.

14. The computer program product of claim 8, wherein after loading the control file onto the second solid state memory device, a state of the second solid state memory device is exactly equal to a state of the first solid state memory device.

15. A method for performance testing of solid state memory devices, the method comprising:

selecting a period of time to operate a first solid state memory device for the first solid state memory device to reach a desired preconditioned state;

operating, by a processor, the first solid state memory device for the period of time;

capturing state information of the first solid state memory device after the period of time, wherein the state information includes only a program-erase cycle count and a logical to physical mapping table and wear leveling data, and does not include user data written to the first solid state memory device;

storing the state information in a control file;

loading the control file into a simulator;

simulating activity of a solid state memory device for a second period of time;

generating a second control file by the simulator;

loading the second control file onto a second solid state memory device; and adapting the state information to fix any issues due to physical variation;

performing performance testing on the second solid state memory device without preconditioning the second solid state memory device.

16. The method of claim 15, wherein the state information includes volatile state information and non-volatile state information.

17. The method of claim 15, wherein the first solid state memory device and the second solid state memory device have a same architecture.

* * * * *